United States Patent [19]
Mishima et al.

[11] Patent Number: 5,600,680
[45] Date of Patent: Feb. 4, 1997

[54] HIGH FREQUENCY RECEIVING APPARATUS

[75] Inventors: Akira Mishima, Motosu-gun; Hiroshi Nagai, Ichinomiya; Akio Iwase, Nishikasugai-gun, all of Japan

[73] Assignee: Matsushita Electric Industrial Co., Ltd., Osaka, Japan

[21] Appl. No.: 525,247

[22] Filed: Sep. 8, 1995

Related U.S. Application Data

[63] Continuation of Ser. No. 252,103, Jun. 1, 1994, abandoned.

[30] Foreign Application Priority Data

Jun. 1, 1993 [JP] Japan .................................. 5-130325

[51] Int. Cl.$^6$ .............................. H03D 5/00; H03D 9/00
[52] U.S. Cl. ...................... 375/327; 375/344; 329/325; 329/360; 348/536; 348/735; 455/260; 455/262; 455/265
[58] Field of Search ................................ 375/324–327, 375/344–345, 376; 329/302, 306–308, 323, 325, 346, 360; 348/536, 725–726, 735; 455/260–262, 265, 285

[56] References Cited

U.S. PATENT DOCUMENTS

| | | | |
|---|---|---|---|
| 3,784,917 | 1/1974 | Kenyon ................................ | 455/262 X |
| 4,642,573 | 2/1987 | Noda et al. ........................... | 375/327 |
| 4,871,973 | 10/1989 | Yoshihara ............................. | 329/308 |
| 5,128,626 | 7/1992 | Iwasaki ................................ | 329/307 |
| 5,179,729 | 1/1993 | Mishima et al. ..................... | 455/260 |
| 5,325,401 | 6/1994 | Halik et al. .......................... | 329/307 |
| 5,335,354 | 8/1994 | Koike ................................... | 455/265 X |
| 5,396,521 | 3/1995 | Minami ................................ | 375/344 |
| 5,483,687 | 1/1996 | Barrett, Jr. et al. .................. | 455/265 X |
| 5,499,392 | 3/1996 | Grunwell ............................. | 455/260 |

*Primary Examiner*—Young T. Tse
*Attorney, Agent, or Firm*—McDermott, Will & Emery

[57] ABSTRACT

A high frequency television signal receiving apparatus providing excellent linear detection of output characteristics by improving the phase characteristic of the picture synchronous detector. A variable capacitive element is equivalently connected in parallel to a reference solid-state oscillation element. The reference solid-state oscillation element controls the frequency of a local oscillation device including a PLL circuit for feeding a local oscillation signal to a mixer for converting a high frequency signal into an intermediate frequency signal. A first low pass filter is connected between a phase comparator for detecting a phase difference of the intermediate frequency signal and the output of a detection oscillator for generating a detection oscillation signal with a specific phase difference. A second low pass filter having a larger time constant than the first low pass filter is connected to the variable capacitive element. The capacitance of the variable capacitive element is varied by the output voltage of the phase comparator. The signal frequency of the local oscillation device is shifted, and is controlled to converge the frequency of the intermediate frequency signal within the frequency range of the detection oscillation signal.

7 Claims, 3 Drawing Sheets

HIGH FREQUENCY RECEIVING APPARATUS

This is a continuation divisional application of application Ser. No. 08/252,103, filed Jun. 1, 1994, now abandoned.

FIELD OF THE INVENTION

This invention relates to a high frequency receiving apparatus for use in reception of high frequency television signals and the like, and more particularly to an improvement of reception picture quality by improving the phase stability and hence enhancing the linearity of detection characteristics.

BACKGROUND OF THE INVENTION

Recently, in addition to ground waves, CATV systems and satellite broadcasting waves have been developed for the transmission of television signals. Using these new transmission techniques, the need for a system that can transmit stable high quality pictures has increased.

FIG. 4 is an example of a prior art high frequency receiving apparatus. As shown in the figure, a high frequency television signal entering from an input terminal 44 of a tuner unit is amplified in a high frequency amplifier 45, and is fed into one input terminal 46a of a mixer 46. A local oscillation frequency from an oscillator 49 enters the other input terminal 46b of the mixer 46. The differential frequency of the frequencies at these two input terminals is delivered from the mixer 46 as an intermediate frequency signal to an intermediate frequency filter 50. The frequency of the oscillator 49 is controlled by a phase locked loop (PLL) circuit 48 based on the natural frequency of a reference solid-state oscillator element (usually a quartz oscillator) 47. The intermediate frequency output of this tuner unit is input to a picture detector, described below, through the intermediate frequency filter 50.

In the picture detector, an input intermediate frequency signal from the intermediate frequency filter 50 is amplified in an intermediate frequency amplifier 51. The output of the intermediate frequency amplifier 51 is fed into one input terminal 52a of a video synchronous detector 52 and one input terminal 56a of a phase comparator 56. The output of the phase comparator 56 passes through a low pass filter 57 and goes into a detection oscillator 54. The output of the detection oscillator 54 is applied to a first phase shifter 55 for shifting its phase by $+\pi/4$(rad) and a second phase shifter 58 for shifting its phase by $-\pi/4$(rad). The output of the first phase shifter 55 is applied to the other input terminal 56b of the phase comparator 56, and the output of the second phase shifter 58 is applied to the other input terminal 52b of the video synchronous detector 52. The output of the video synchronous detector 52 is fed to an output terminal 53.

During picture detection, the intermediate frequency signal which is the output of the tuner unit is amplified in the intermediate frequency amplifier 51, and its output is divided into two inputs, one of which is applied to one input terminal 56a of the phase comparator 56, and is shifted in phase by $+\pi/4$(rad) in the first phase shifter 55 and is compared with the output of the detection oscillator 54 received from the other input terminal 56b. The output of the detection oscillator 54 is deviated in phase by $-\lambda/4$(rad) from the intermediate frequency signal, and is combined with a phase deviation of $-\lambda/4$(rad) in the second phase shifter 58. A signal deviated by $-\pi/4$(rad) from the intermediate frequency is added to the other input terminal 52b of the phase synchronous detector 52, and the intermediate frequency of the output of the intermediate frequency amplifier 51 is switched thereby causing synchronous picture detection.

In this type of conventional construction, if there is a steep change in waveform in the direction of deepening the degree of amplitude in amplitude modulation, i.e., if the video signal changes steeply to a white level as shown in part A in FIG. 5(a), to reproduce the original waveform correctly when this waveform is demodulated, it is important that the phase stability be high even if the amplitude of the video carrier entering the phase comparator 56 decreases suddenly. In the conventional detection oscillator 54, in order to cope with the offset of the video carrier frequency, in the detection characteristic, it is of utmost importance to protect the drawing stability of the picture detector against fluctuations of intermediate frequency. Thus, a detection oscillator having low phase stability is used. In the prior art, the oscillation frequency variable range of the detection oscillator 54 is set at about ±200 kHz, a tuning circuit having a low Q is used, and the phase stability is low. As a result, the output of the picture synchronous detector 52 has an overshoot in the white picture signal region due to nonlinearity of input, an output as shown in part B in FIG. 5(b), and linear picture detection is poor.

The prior art described above does not provide the important advantage of superior linear picture detection even when there is a sudden change in the amplitude of the video carrier frequency.

SUMMARY OF THE INVENTION

According to this invention, a high frequency receiving apparatus is provided for performing picture synchronous detection to achieve a high resolution picture by improving the linearity of the detection output. The high frequency receiving apparatus of this invention comprises a mixer for mixing a local oscillation signal with an input frequency signal for obtaining an intermediate frequency signal. The frequency of an oscillator providing the local oscillation signal is controlled by a PLL system on the basis of the oscillation frequency of a reference solid-state oscillation element. The local oscillation signal is then fed to the mixer. A detection oscillator generates an oscillation signal for synchronous picture detection, and a picture synchronous detector produces a detection output of a specific phase difference from the oscillation signal of the detection oscillator based on the intermediate frequency signal. A phase comparator compares the phase between the intermediate frequency signal and the oscillation signal of the detection oscillator to determine the frequency error between the two signals. A variable capacitive element is equivalently connected in parallel to a reference solid-state oscillation element of the local oscillator for converting a voltage change into a capacitance change, and a voltage feedback means applies an output voltage of the phase comparator to the variable capacitive element.

The output change of the phase comparator due to generation of frequency error is applied to the variable capacitive element through the voltage feedback means, and the capacitance change of the variable capacitive element due to this applied voltage is varied in the direction of converging the intermediate frequency within the oscillation frequency range of the detection oscillator.

Furthermore, in the voltage feedback means, a first low pass filter is provided between the phase comparator and the detection oscillator, and a second low pass filter is provided between a connection point of the first low pass filter with the detection oscillator and the variable capacitive element.

The second low pass filter has a larger time constant than the first low pass filter so that fluctuations occurring in a short period of time in the picture synchronous detection circuit are not sent to the local oscillation means.

It is another object of the invention to provide a double superheterodyne system which provides an intermediate frequency having excellent phase characteristics to be used by the picture detection unit of the invention.

In accordance with this object of the invention, a first mixer is provided for mixing a first local oscillation signal to an input high frequency signal to obtain a first intermediate frequency signal.

A first local oscillating means controls the frequency of an oscillator using a PLL system on the basis of the oscillation frequency of a reference solid-state oscillation element and feeds the first local oscillation signal into the first mixer. A second mixer mixes a second local oscillation signal with the first intermediate frequency signal to obtain a second intermediate frequency signal. A second local oscillation means controls the frequency of a second oscillator using a PLL system on the basis of the oscillation frequency of the reference solid-state oscillation element and feeds a second local oscillation signal to the second mixer. The system also includes a voltage feedback means as described above and a variable capacitive element, connected equivalently in parallel to the reference solid-state oscillation element of the second local oscillation means from the phase comparator, for converting a voltage change into a capacitance change. The output change of the phase comparator due to generation of frequency error is applied to the variable capacitive element through a voltage feedback means.

In accordance with the invention, if the phase difference between the output of the detection oscillator and the intermediate frequency is not $\pi/4$(rad), the frequency is controlled by the PLL circuit, and the oscillation frequency of the local oscillation means for determining the intermediate frequency can be finely adjusted.

Thus, by applying an output voltage of the phase comparator to the variable capacitive element as a parallel capacitance of the reference solid-state oscillation element as the reference of the frequency of the PLL circuit, the capacitance of the variable capacitive element is finely adjusted. As a result, the frequency of the reference solid-state oscillation element is finely adjusted, the frequency of the local oscillation means is finely adjusted, and then the intermediate frequency is finely adjusted, thus making it possible to accurately adjust the intermediate frequency within the oscillation frequency range of the detection oscillator. As a result, the phase difference between the oscillation output signal of the detection oscillator and the intermediate frequency signal can be kept at $\pi/4$(rad).

Furthermore, in the voltage feedback means, a first low pass filter is provided between the phase comparator and the detection oscillator, and a second low pass filter is provided between a connection point of the first low pass filter with the detection oscillator and the variable capacitive element. By decreasing the time constant of the first low pass filter, it is possible to follow abrupt changes of the video carrier amplitude. Also, by setting the time constant of the second low pass filter larger than the time constant of the first low pass filter, effects of fluctuations occurring in a short period of time in the picture synchronous detection circuit are not sent to the local oscillation means and linear detection is improved resulting in a high quality picture.

It is another object of this invention to provide a method of controlling the intermediate frequency signal to provide improved synchronous picture detection.

As pointed out in greater detail below, the high frequency receiving apparatus and method of controlling intermediate frequency of this invention provide important advantages.

The invention itself, together with further objects and attendant advantages, will best be understood by reference to the following detailed description taken in conjunction with the accompanying drawings.

BRIEF DESCRIPTION OF THE DRAWINGS

FIG. 5(*b*) is a video signal waveform after demodulating the white level video intermediate frequency signal in pulse form in FIG. 5(*a*).

DESCRIPTION OF THE PREFERRED INVENTION

Figure 1:
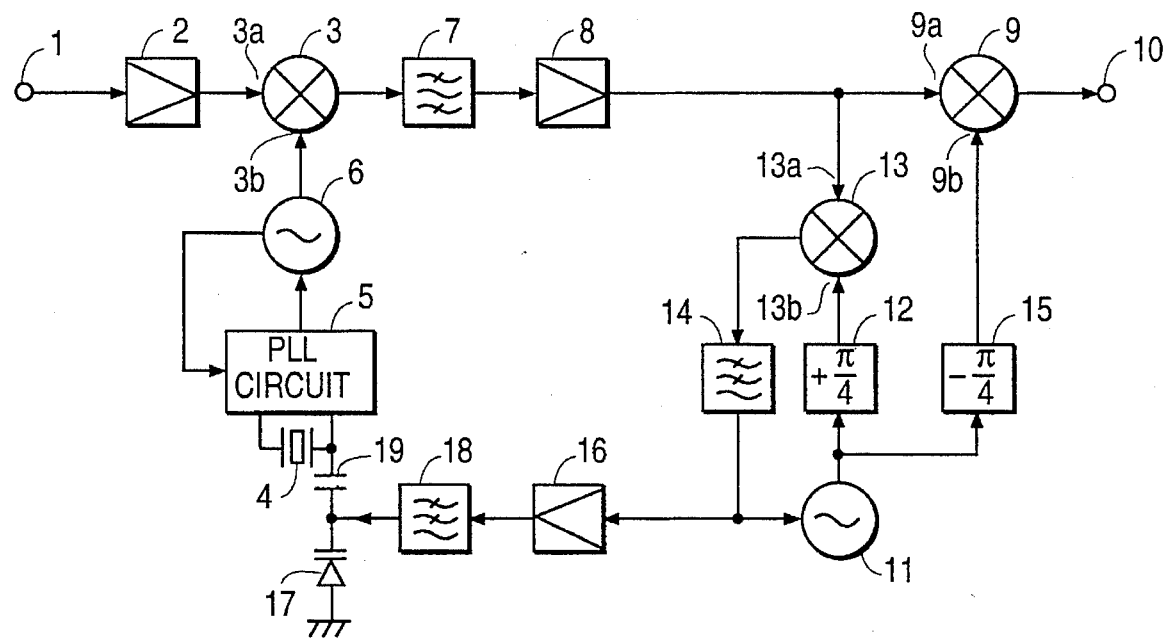
FIG. 1 is a block diagram of a high frequency receiving apparatus in accordance with the preferred embodiment.

Turning now to the drawings, FIG. 1 shows an input terminal 1 of a tuner unit which receives a high frequency television signal. The signal is amplified in a high frequency amplifier 2, and input to one input terminal 3*a* of a mixer 3. A local oscillation frequency from an oscillator 6 enters the other input terminal 3*b* of the mixer 3. The differential frequency of these two input terminal frequencies is delivered from the mixer 3 as an intermediate frequency signal. The oscillator 6 has its frequency controlled by a PLL circuit 5 on the basis of the natural frequency of a reference solid-state oscillation element 4, and selects the station. The reference solid-state oscillation element 4, the PLL circuit 5, and the oscillator 6 comprise a local oscillation means.

In the preferred embodiment, a quartz oscillator is used as the reference solid-state oscillation element 4, and a reference oscillation frequency of 4 MHz is generated. Also in the preferred embodiment, a pulse swallow method is employed in the PLL circuit system. Using the pulse swallow method, a swallow divider for dividing into 1/32 and 1/33 is placed in a rear stage of a pre-divider for dividing into 1/8, and a main counter with dividing ratio M and a swallow counter with dividing ratio S are placed behind the swallow divider. PLL station selection is conducted using a reference frequency for phase comparison Fref (=4000/512=7.8125 kHz) having the oscillation frequency of the quartz oscillator of 4 MHz divided to 1/512. In this condition, the oscillation frequency F of the oscillator 6 is expressed in formula (1).

$$F = Fref \times 8 \times (32 \times M + S) = 62.5 \times (32 \times M + S) \ [kHz] \tag{1}$$

The minimum variable step frequency is Fref×8 or 62.5 kHz, and the precision of the intermediate frequency cannot be set to a frequency smaller than one-half the minimum variable step frequency or 31.25 kHz.

The output of the tuner unit is applied to a picture detector, described below, through an intermediate frequency filter 7.

In the picture detector, the input signal is amplified in an intermediate frequency amplifier 8, and its output is input to one input terminal 9a of a picture synchronous detector 9 and to one input terminal 13a of a phase comparator 13. The output of the phase comparator 13 passes through a first low pass filter 14, and is input to a detection oscillator 11. The output of the detection oscillator 11 is input to a first phase shifter 12 for shifting its phase by $+\pi/4$(rad) and a second phase shifter 15 for shifting its phase by $-\pi/4$(rad). The output of the first phase shifter 12 is input to the other input terminal 13b of the phase comparator 13. The output of the second phase shifter 15 is input to the other input terminal 9b of the picture synchronous detector 9, and the output of the picture synchronous detector 9 is output to an output terminal 10.

During picture detection, the intermediate frequency signal which is an output of the tuner unit is amplified in the intermediate frequency amplifier 8, and one of the two branched outputs is input to one input terminal 13a of the phase comparator 13, and is compared with the phase of the output of the detection oscillator 11 shifted in phase by $+\pi/4$(rad) in the first phase shifter 12. Hence, the output of the detection oscillator 11 is shifted in phase by $-\pi/4$(rad) from the intermediate frequency, and a phase shift of $-\pi/4$(rad) is added thereto in the second phase shifter 15. An oscillation output shifted in phase by $-\pi/4$(rad) from the intermediate frequency signal is applied to the other input terminal 9b of the phase synchronous detector 9, and the intermediate frequency signal of the output of the intermediate frequency amplifier 8 is switched, thereby causing synchronous picture detection.

In the preferred embodiment, the center frequency of the detection oscillator 11 is, for example, 58.75 MHz. In order for the phase stability of the detection oscillator 11 to be high, the Q of the tuning circuit must be raised. Thus, the oscillation frequency variable range is set narrow, around ±20 kHz compared with ±200 kHz in the prior art. Accordingly, when a large frequency error occurs in PLL station selection, the phase difference between the oscillation frequency of the detection oscillator 11 and the intermediate frequency signal cannot be kept at $\pi/4$(rad), and picture detection is disabled.

In this invention, a capacitor 19 (about 100 pF in the preferred embodiment) is connected to the hot side of the solid-state oscillation element 4 in the tuner unit, and the cathode of a variable capacitive element 17 is connected to the other end of the capacitor 19. The anode of the variable capacitive element 17 is grounded. As a result, the variable capacitive element 17 is equivalently connected parallel to the solid-state oscillation element 4. Acting as a voltage feedback means, the output of a first low pass filter 14 is connected to a buffer amplifier 16 with high input impedance, and the output of the buffer amplifier 16 is connected to a second low pass filter 18. The output of the low pass filter 18 is connected to the junction of the capacitor 19 and the cathode of the variable capacitive element 17.

Merely by way of example, operation of the high frequency receiving apparatus of FIG. 1 is described with reference to a CATV system. For example, in a CATV system a video carrier frequency of 91.25 MHz, is offset by 40 kHz to become 91.29 MHz.

Assuming dividing ratios in formula (1) above of M=75 and S=1, the oscillation frequency F of the oscillator 6 is 150.0625 MHz, and the intermediate frequency of the difference from the video carrier frequency 91.29 MHz is 58.7725 MHz.

As stated above, since the oscillation frequency of the detection oscillator 11 is set at 58.75 MHz±20 kHz, the variable range of the detection oscillator 11 is short of 2.5 kHz, and a defect occurs in synchronous picture detection.

To set the oscillation frequency F of the oscillator 6 to be $$F=58.75+91.29=150.04 \ [MHz]$$

the phase comparison reference frequency $Fref_1$ is determined by modifying formula (1)

$$Fref_1=150040/\{8\times(32\times75+1)\}=7.81132 \ [kHz]$$

and the phase comparison reference frequency Fref is finely adjusted to satisfy the above equation.

In the preferred embodiment, as stated above, since the quartz oscillation frequency is divided by 512, the oscillation frequency $F_Q$ of the quartz oscillator must be $$F_Q=Fref_1\times 512/1000=3.9940 \ [MHz]$$

This corresponds to $-150$ ppm relative to the oscillation frequency 4 MHz of the quartz oscillator.

Accordingly, the voltage feedback means operates to change the oscillation frequency of the reference solid-state oscillation element by $-150$ ppm. In other words, the frequency of the input intermediate frequency signal to the picture synchronous detector 9 and the output voltage of the phase comparator 13 are inversely proportional. When the output voltage of the phase comparator 13 is lowered due to generation of frequency error to the higher frequency side as in this example, it passes through the first low pass filter 14 to be fed into the buffer amplifier 16 with a sufficiently high input impedance. The output of the buffer amplifier 16 passes through the second low pass filter 18 to lower the applied voltage to the cathode of the variable capacitive element 17. Hence, the capacitance of the variable capacitive element 17 is increased, and by lowering the oscillation frequency of the reference solid-state oscillation element 4 (a quartz oscillator in the preferred embodiment) by 150 ppm, the frequency of the intermediate frequency signal is shifted to lower side, thereby converging within the variable range of the detection oscillator 11.

Figure 3:
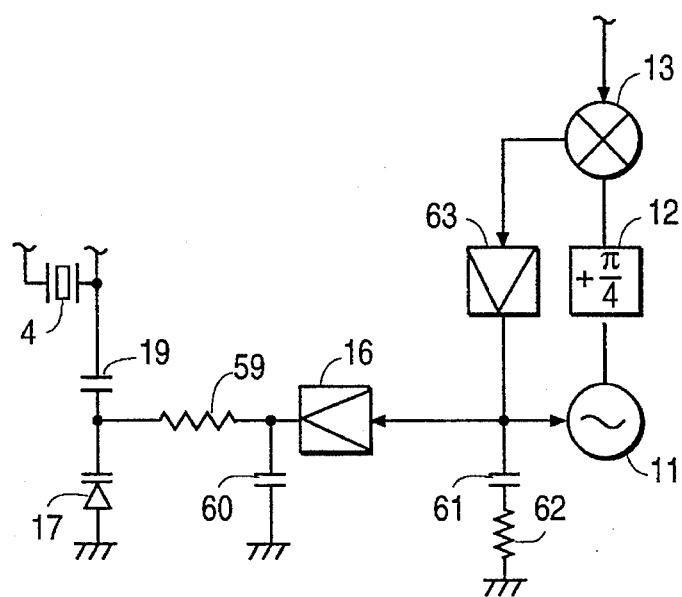
FIG. 3 is a block diagram of a portion of the high frequency receiving apparatus of FIG. 1.

FIG. 3 is a detailed block diagram of a portion of the high frequency receiving apparatus of FIG. 1. In FIG. 3, a series circuit of a capacitor 61 and a resistor 62 is provided between the output of an amplifier 63 and the ground, thereby comprising the first low pass filter 14 in FIG. 1. The second low pass filter 18 in FIG. 1 is comprised of a capacitor 60 provided between the output of the buffer amplifier 16 and the ground and a resistor 59 provided between the output side of the buffer amplifier 16 and the cathode of the variable capacitive element 17.

Merely by way of example, assume the first low pass filter consist of the resistor 62 having a resistance of 560Å and the capacitor 61 having a capacitance of 0.33 μF, with a time constant of 0.2 msec. Further assume, the resistor 59 of the second low pass filter is 33 kÅ and the capacitor 60 is 0.47 μF, and the time constant is 15 msec.

Since the time constant of the first low pass filter is small, it is possible to follow up abrupt changes in the video carrier amplitude.

Additionally, by setting the time constant of the second low pass filter larger than the time constant of the first low pass filter, fluctuations occurring in a short period of time at the detection oscillator side are not transmitted to the reference solid-state oscillation element side.

Figure 2:
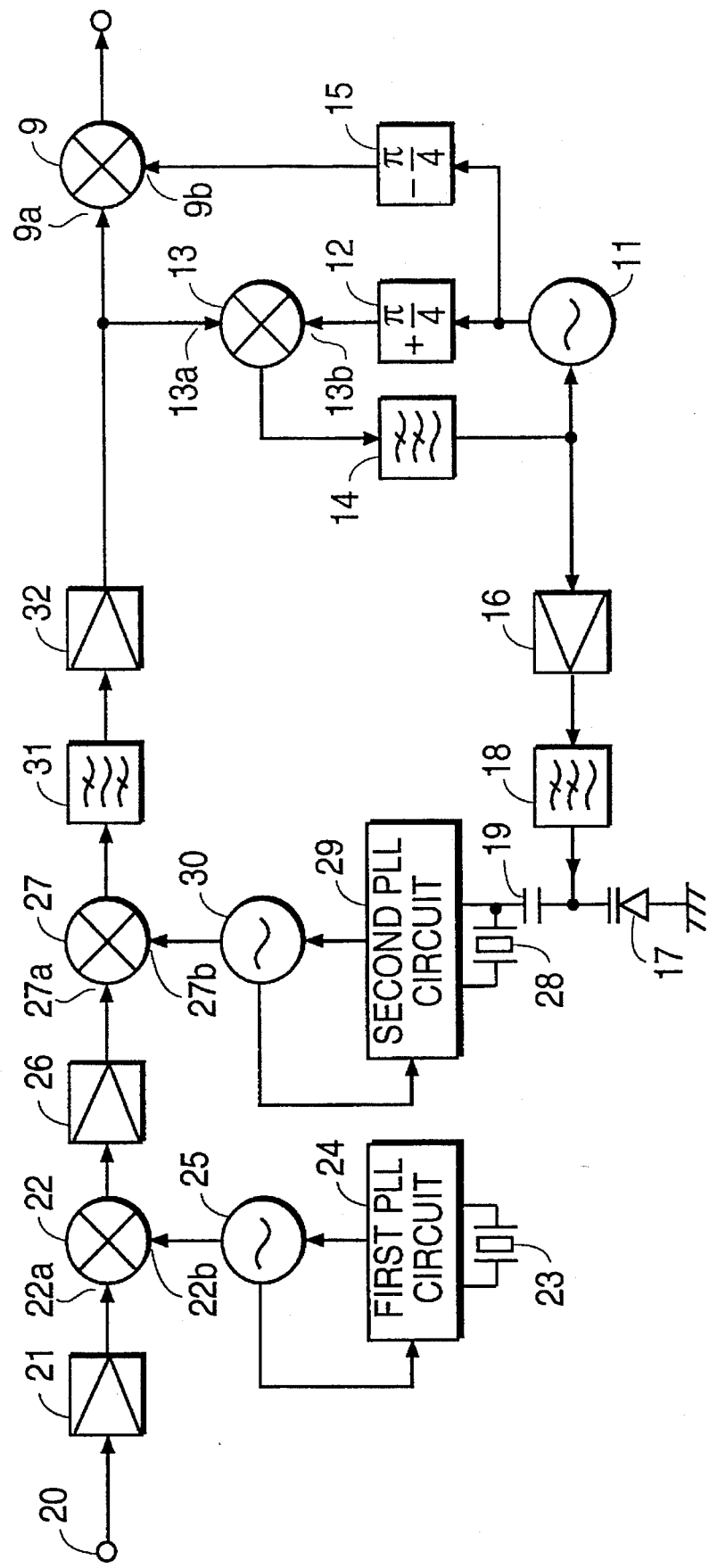
FIG. 2 is a block diagram of an alternative embodiment of a high frequency receiving apparatus.
Figure 4:
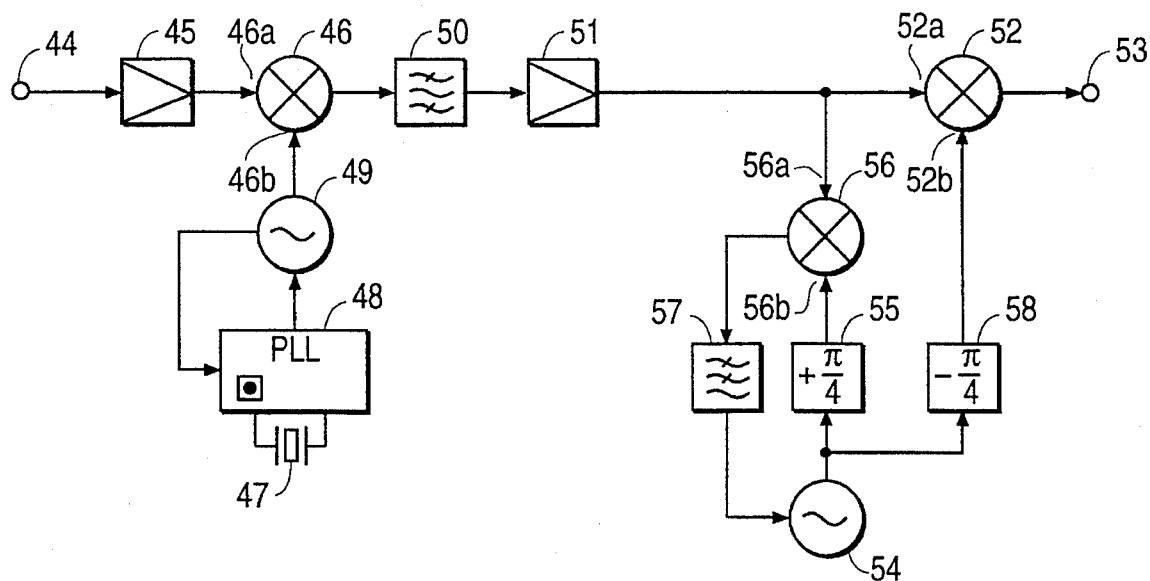
FIG. 4 is a block diagram of a prior art high frequency receiving apparatus.
Figure 5A:
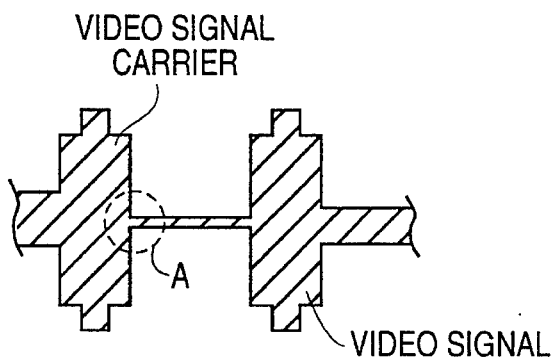
FIG. 5(*a*) is a waveform diagram of a white level video intermediate frequency signal in pulse form.
Figure 5B:
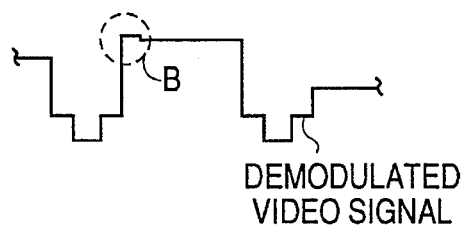

Another variation of the invention is described with reference to FIG. 2. In FIG. 2, a high frequency television signal entering from an input terminal 20 is amplified in a high frequency amplifier 21, and is input to one input terminal 22a of a first mixer 22. A local oscillation frequency from a first oscillator 25 enters the other input terminal 22b of this first mixer 22. The intermediate frequency signal of the differential frequency of these two input terminal frequencies is output from the first mixer 22. The frequency of the first oscillator 25 is controlled by a first PLL circuit 24 on the basis of the natural frequency of the first reference solid-stage oscillation element 23. The high frequency amplifier 21, the first mixer 22, the first oscillator 25, the first PLL circuit 24, and the first reference solid-stage oscillation element 23 form an up converter of a double superheterodyne type tuner.

The output of the first mixer 22 is amplified in a first intermediate frequency amplifier 26, and is input to one input terminal 27a of a second mixer 27. A local oscillation frequency from a second oscillator 30 enters the other input terminal 27b of the second mixer 27. A second intermediate frequency signal of differential frequency of these two input terminal frequencies is output from the second mixer 27. The frequency of the second oscillator 30 is controlled by a second PLL circuit 29 on the basis of the natural frequency of a second reference solid-state oscillation element 28.

The first intermediate frequency amplifier 26, the second mixer 27, the second oscillator 30, the second reference solid-state oscillation element 28, and the second PLL circuit 29 form a down converter of a double superheterodyne type tuner.

The up converter and down converter form a double superheterodyne type tuner. The first and second reference solid-state oscillation elements 23 and 28 have a reference oscillation frequency of 4 MHz using a quartz oscillator as described in the first embodiment. The station selection method is the pulse swallow type PLL method, as described in the first embodiment, in both the up and down converters. Therefore, as in the first embodiment, the frequency precision of the second intermediate frequency signal which is the output of the second mixer 27 cannot be set smaller than 31.25 kHz. Moreover, since two quartz oscillators are used instead of one, errors in the oscillation frequency of the quartz oscillator are accumulated, and the frequency precision of the second intermediate frequency signal deteriorates.

The second intermediate frequency signal is input to one input terminal 9a of the picture synchronous detector 9 through a second intermediate frequency filter 31 and a second intermediate frequency amplifier 32. The circuit, after the picture synchronous detector 9, functions like that of the first embodiment in FIG. 1. Hence, the same reference numerals in FIG. 1 are given to elements having the same functions, and their detailed descriptions are omitted.

According to the embodiment of FIG. 2, just as in the first embodiment, by applying the output of the phase comparator 13 to the variable capacitive element 17 connected to the second reference solid-state oscillation element 28 through a capacitor 19 by way of the first low pass filter 14, buffer amplifier 16, and second low pass filter 18, the intermediate frequency is finely adjusted to converge within the variable range of the detection oscillator 11. The intermediate frequency corresponds to the offset of the input high frequency signal, just as in the first embodiment, in the superheterodyne type tuner, thereby canceling the cumulative error of oscillation frequency caused by using two solid-state oscillation elements.

Since the intermediate frequency can be adjusted finely, the picture detection circuit having excellent phase characteristics can be used. Thus, the linearity of detection output characteristics can be improved.

According to the invention, as described herein, if the phase difference between the output of the detection oscillator 11 and the input intermediate frequency signal is not π/4(rad) in the picture synchronous detector, the oscillation frequency of the PLL circuit 29 for determining the intermediate frequency is finely adjusted by varying the parallel capacitance of the solid-state oscillation element 28 as the reference of the PLL circuit 29 frequency.

Thus, by applying an output voltage of the phase comparator 13 to the variable capacitive element 17 as a parallel capacitance of the reference solid-state oscillation element 28 as the reference of the frequency of the PLL circuit 29, the capacitance of the variable capacitive element 17 is finely adjusted. As a result, the frequency of the reference solid-state oscillation element 28 is finely adjusted, the frequency of the local oscillation means is finely adjusted, and then the intermediate frequency is finely adjusted, thus making it possible to accurately adjust the intermediate frequency within the oscillation frequency range of the detection oscillator. As a result, the phase difference between the oscillation output signal of the detection oscillator and the intermediate frequency signal can be kept at π/4(rad).

Hence, the frequency of the intermediate frequency signal can be accurately adjusted within the oscillation frequency range of the detection oscillator, and the phase characteristic of the picture detection circuit can be enhanced. Therefore, the linearity of the detection output characteristic can be improved, so that a picture having high resolution is reproduced.

Of course, it should be understood that a wide range of changes and modifications can be made to the embodiments described above. It is therefore intended that the foregoing detailed description be regarded as illustrative rather than limiting and that it be understood that it is the following claims, including all equivalents, which are intended to define the scope of this invention.

What is claimed is:

1. A high frequency receiving apparatus comprising:

a mixer for mixing a local oscillation signal with a high frequency input signal to obtain an intermediate frequency signal;

a local oscillation device for controlling a frequency of an oscillator with a PLL system on the basis of an oscillation frequency of a reference solid-state oscillation element and for sending said local oscillation signal to said mixer;

a detection oscillator for generating an oscillation signal for picture synchronous detection;

a picture synchronous detector for producing a detection output having a specific phase difference from said oscillation signal of said detection oscillator based upon said intermediate frequency signal;

a phase comparator for comparing a phase difference between said intermediate frequency signal and said oscillation signal of said detection oscillator;

a variable capacitive element equivalently connected in parallel to said reference solid-state oscillation element of said local oscillation device for converting a voltage change into a capacitance change; and a voltage feedback device for applying an output voltage of said phase comparator to said variable capacitive element.

2. The high frequency receiving apparatus of claim 1, wherein the capacitance change of the variable capacitive element corresponding to said voltage change is varied in the direction of converging said intermediate frequency signal within an oscillation frequency range of said detection oscillator.

3. A high frequency receiving apparatus comprising:

a first mixer for mixing a first local oscillation signal with a high frequency input signal to obtain a first intermediate frequency signal;

a first local oscillation device for controlling a frequency of a first oscillator with a PLL system on the basis of an oscillation frequency of a first reference solid-state oscillation element, and for sending said first local oscillation signal into said first mixer;

a second mixer for mixing a second local oscillation signal with said first intermediate frequency signal to obtain a second intermediate frequency signal;

a second local oscillation device for controlling a frequency of a second oscillator with a PLL system on the basis of an oscillation frequency of a second reference solid-state oscillation element and for sending said second local oscillation signal to said second mixer;

a detection oscillator for generating an oscillation signal for picture synchronous detection;

a picture synchronous detector for producing a detection output having a specific phase difference from said oscillation signal of said detection oscillator based upon said second intermediate frequency signal;

a phase comparator for comparing a phase difference between said second intermediate frequency signal and said oscillation signal of said detection oscillator;

a variable capacitive element equivalently connected in parallel to said second reference solid-state oscillation element of said second local oscillation device for converting a voltage change into a capacitance change; and a voltage feedback device for applying an output voltage of said phase comparator to said variable capacitive element.

4. The high frequency receiving apparatus of claim 3, wherein the capacitance change of the variable capacitive element corresponding to said voltage change is varied in the direction of converging said first intermediate frequency signal and said second intermediate frequency signal within an oscillation frequency range of said detection oscillator.

5. The high frequency receiving apparatus of claim 2 or claim 4, wherein said voltage feedback device comprises a first low pass filter provided between said phase comparator and said detection oscillator, and a second low pass filter provided between a connection point of the first low pass filter with said detection oscillator and said variable capacitive element.

6. The high frequency receiving apparatus of claim 5, wherein said second low pass filter has a larger time constant than said first low pass filter.

7. A method for synchronous detection of high frequency signals, comprising the steps of:

receiving a high frequency input signal;

providing a local oscillator for sending a local oscillation signal to a mixer;

controlling a frequency of said local oscillator with a PLL system on the basis of an oscillation frequency of a reference solid-state oscillation element;

connecting a variable capacitive element equivalently in parallel to said reference solid-state oscillation element for converting a voltage change to a capacitance change to control said reference solid-state oscillation element;

mixing said local oscillation signal with said high frequency input signal by said mixer to obtain an intermediate frequency signal;

generating an oscillation signal by a detection oscillator for picture synchronous detection based on said intermediate frequency signal;

comparing a phase difference between said intermediate frequency signal and said oscillation signal of said detection oscillator;

producing a detection output based on a specific phase difference between said oscillation signal of said detection oscillator and said intermediate frequency signal; and applying an output voltage of the phase comparison to said variable capacitive element to change a capacitance of said variable capacitive element such that said intermediate frequency converges within an oscillation frequency range of said detection oscillator.

* * * * *